(12) United States Patent
Falster et al.

(10) Patent No.: US 9,583,363 B2
(45) Date of Patent: Feb. 28, 2017

(54) PROCESSES AND APPARATUS FOR PREPARING HETEROSTRUCTURES WITH REDUCED STRAIN BY RADIAL DISTENSION

(71) Applicant: SunEdison Semiconductor Limited (UEN201334164H), St. Peters, MO (US)

(72) Inventors: Robert J. Falster, London (GB); Vladimir V. Voronkov, Merano (IT); John A. Pitney, O'Fallon, MO (US); Peter D. Albrecht, O'Fallon, MO (US)

(73) Assignee: SunEdison Semiconductor Limited (UEN201334164H), St. Peters, MO (US)

( * ) Notice: Subject to any disclaimer, the term of this patent is extended or adjusted under 35 U.S.C. 154(b) by 425 days.

(21) Appl. No.: 14/142,553

(22) Filed: Dec. 27, 2013

(65) Prior Publication Data

US 2014/0187022 A1    Jul. 3, 2014

Related U.S. Application Data

(60) Provisional application No. 61/793,999, filed on Mar. 15, 2013, provisional application No. 61/747,613, filed on Dec. 31, 2012, provisional application No. 61/790,445, filed on Mar. 15, 2013, provisional application No. 61/788,744, filed on Mar. 15, 2013.

(51) Int. Cl.
*H01L 21/322* (2006.01)
*H01L 21/302* (2006.01)
*H01L 21/687* (2006.01)
*C30B 25/12* (2006.01)

(52) U.S. Cl.
CPC ............ *H01L 21/322* (2013.01); *C30B 25/12* (2013.01); *H01L 21/302* (2013.01); *H01L 21/6875* (2013.01); *H01L 21/68735* (2013.01)

(58) Field of Classification Search
CPC . H01L 21/302; H01L 21/322; H01L 21/6875; H01L 21/68735; C30B 25/12
USPC .................................................. 438/455, 457
See application file for complete search history.

(56) References Cited

U.S. PATENT DOCUMENTS

| | | |
|---|---|---|
| 4,391,511 A | 7/1983 | Akiyama et al. |
| 4,473,455 A | 9/1984 | Dean et al. |

(Continued)

FOREIGN PATENT DOCUMENTS

| | | |
|---|---|---|
| EP | 1901345 A1 | 3/2008 |
| EP | 2151852 A1 | 2/2010 |

(Continued)

OTHER PUBLICATIONS

Leroy et al., "Warpage of Silicon", J. Electrochem. Soc.:Solid State Science and Technology, vol. 127, No. 4, Apr. 1980, pp. 961-970.*

(Continued)

*Primary Examiner* — Mary Wilczewski
(74) *Attorney, Agent, or Firm* — Armstrong Teasdale LLP

(57) ABSTRACT

Apparatus and processes for preparing heterostructures with reduced strain are disclosed. The heterostructures may include a semiconductor structure that conforms to a surface layer having a different crystal lattice constant than the structure to form a relatively low-defect heterostructure.

19 Claims, 21 Drawing Sheets

(56) References Cited

U.S. PATENT DOCUMENTS

| | | | |
|---|---|---|---|
| 4,842,683 A * | 6/1989 | Cheng | H01J 37/32431 156/345.37 |
| 5,310,453 A * | 5/1994 | Fukasawa | H01L 21/6833 438/716 |
| 6,024,828 A | 2/2000 | Hwang | |
| 6,464,780 B1 | 10/2002 | Mantl et al. | |
| 6,494,769 B1 * | 12/2002 | Sinclair | B24B 37/30 451/288 |
| 6,513,848 B1 | 2/2003 | Shendon et al. | |
| 6,743,495 B2 | 6/2004 | Vasat et al. | |
| 6,881,632 B2 * | 4/2005 | Fitzgerald | H01L 21/82380 257/E21.633 |
| 7,186,628 B2 * | 3/2007 | Nakano | H01L 21/76254 257/E21.122 |
| 7,232,591 B2 * | 6/2007 | Okumura | C03C 17/23 118/728 |
| 7,550,309 B2 * | 6/2009 | Yokokawa | C30B 29/30 257/12 |
| 7,732,301 B1 | 6/2010 | Pinnington et al. | |
| 7,855,127 B2 * | 12/2010 | Akiyama | H01L 21/76254 257/55 |
| 7,994,595 B2 * | 8/2011 | Forbes | H01L 21/76254 257/288 |
| 8,772,128 B2 * | 7/2014 | Yamazaki | B23K 26/03 257/E21.567 |
| 9,224,904 B1 | 12/2015 | Kumar et al. | |
| 9,230,862 B2 * | 1/2016 | Yano | H01L 21/78 |
| 2002/0023590 A1 | 2/2002 | Storbeck | |
| 2003/0209326 A1 * | 11/2003 | Lee | C23C 16/4583 156/345.52 |
| 2004/0160582 A1 | 8/2004 | Lof et al. | |
| 2006/0091377 A1 | 5/2006 | Boyd et al. | |
| 2007/0049020 A1 | 3/2007 | Huang et al. | |
| 2012/0139192 A1 | 6/2012 | Ooi | |
| 2012/0269498 A1 | 10/2012 | Kang et al. | |
| 2014/0182788 A1 * | 7/2014 | Falster | H01L 21/302 156/443 |
| 2014/0187022 A1 * | 7/2014 | Falster | H01L 21/302 438/476 |
| 2014/0187023 A1 * | 7/2014 | Falster | H01L 21/302 438/476 |
| 2014/0339672 A1 * | 11/2014 | Yano | H01L 21/78 257/499 |

FOREIGN PATENT DOCUMENTS

| | | |
|---|---|---|
| JP | 59117235 A | 7/1984 |
| JP | 10287497 | 10/1998 |
| JP | 2010147080 A | 7/2010 |
| WO | 2010081617 A1 | 7/2010 |
| WO | WO 2014/106177 * | 7/2014 ........ H01L 21/322 |

OTHER PUBLICATIONS

Invitation to Pay Additional Fees, PCT Application No. PCT/US2013/078224, dated Jun. 25, 2014, pp. 6.

Invitation to Pay Additional Fees, PCT Application No. PCT/US2013/078329, dated Mar. 25, 2014, pp. 6.

Invitation to Pay Additional Fees, PCT Application No. PCT/US2013/078295, dated Apr. 9, 2014, pp. 7.

Pizzagalli et al., Theoretical study of pressure effect on the dislocation core properties in semiconductors, Physical Review B, vol. 79, No. 4, dated Jan. 14, 2009, pp. 1-7.

International Search Report and Written Opinion, Application No. PCT/US2013/078224, dated Sep. 11, 2014, pp. 18.

Co-Owned U.S. Appl. No. 14/142,556; Entitled: Processes and Apparatus for Preparing Heterostructures With Reduced Strain by Radial Compression; filed Dec. 27, 2013; pp. 30.

Co-Owned U.S. Appl. 14/142,559; Entitled: Apparatus for Stressing Semiconductor Substrates; filed Dec. 27, 2013; pp. 27.

* cited by examiner

PROCESSES AND APPARATUS FOR PREPARING HETEROSTRUCTURES WITH REDUCED STRAIN BY RADIAL DISTENSION

CROSS-REFERENCE TO RELATED APPLICATIONS

The present application claims the benefit of U.S. Provisional Application No. 61/747,613, filed Dec. 31, 2012; of U.S. Provisional Application No. 61/793,999, filed Mar. 15, 2013; of U.S. Provisional Application No. 61/790,445, filed Mar. 15, 2013 and of U.S. Provisional Application No. 61/788,744 filed Mar. 15, 2013, each of which is incorporated herein by reference.

FIELD OF THE DISCLOSURE

The present disclosure relates generally to preparation of semiconductor heterostructures with reduced strain and, in particular, to heterostructures with a semiconductor substrate that conforms to a surface layer having a different crystal lattice constant than the substrate, thereby forming a relatively low-defect heterostructure.

BACKGROUND

Multi-layered structures comprising a device layer with a device quality surface and a substrate that has a different crystal lattice structure than the material of the device layer are useful for a number of different purposes. These multi-layered structures typically comprise multiple layers of material having differing lattice constants. The lattice mismatch between layers causes the layers to be strained. Misfit dislocations may spontaneously form in the device layer to relax the strain between layers. Such dislocations degrade the quality and usefulness of the multi-layer semiconductor structure.

A continuing need exists for methods for relaxing the strain between lattice-mismatched semiconductor layers and for methods that result in substrates and device layers that are substantially free of dislocations.

SUMMARY OF THE DISCLOSURE

One aspect of the present disclosure is directed to a process for relaxing the strain in a heterostructure comprising a substrate, a surface layer disposed on the substrate and an interface between the substrate and the surface layer. The substrate comprises a central axis, a back surface which is generally perpendicular to the central axis, and a diameter extending across the substrate through the central axis. A dislocation source layer is formed in the substrate. The substrate is radially distended to generate dislocations and glide the dislocations from the dislocation source layer toward the surface layer.

Another aspect of the present disclosure is directed to a process for preparing a relaxed heterostructure. A surface layer is deposited on a front surface of the semiconductor substrate thereby creating a strain between the surface layer and the substrate. A dislocation source layer is formed in the substrate. The strain in the surface layer and the substrate is relaxed by radially distending the substrate to generate dislocations and glide the dislocations from the dislocation source layer toward the surface layer.

A further aspect of the present disclosure is directed to an apparatus for radially distending a semiconductor structure having a front surface, a back surface and a circumferential edge. The apparatus includes a structure holder comprising a top plate and a back plate for contacting the structure adjacent a circumferential edge of the structure. The top plate is adapted to contact the front surface of the structure and the back plate is adapted to contact the back surface of the structure. The top plate and back plate are further adapted to form a peripheral chamber between the top plate, back plate and circumferential edge of the structure.

An additional aspect of the present disclosure is directed to an apparatus for radially distending a semiconductor structure having a front surface, a back surface, a circumferential edge and a central axis. The apparatus includes triangular-shaped segments that point inward to a central axis. The segments are configured for movement outward from the central axis to cause the structure to distend. Fluid passageways are formed in each segment for forming a vacuum between the segment and structure.

BRIEF DESCRIPTION OF THE DRAWINGS

Corresponding reference characters indicate corresponding parts throughout the drawings.

DETAILED DESCRIPTION

Figure 2:
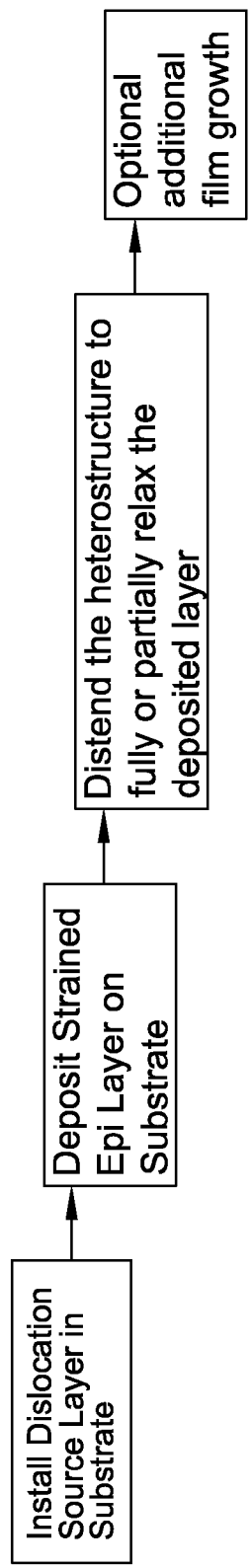
FIG. 2 is a flow diagram depicting a process for preparing a heterostructure.

In accordance with one or more aspects of the present disclosure, heterostructures with reduced strain between the substrate and a surface layer having a different lattice constant than the substrate may be prepared such as by the process of FIG. 2. The surface layer may also be referred to herein as an "epitaxial layer", "heteroepitaxial layer", "deposited film", "film", "heterolayer" or "deposited layer". A heterostructure having a substantially relaxed surface layer and a reduced concentration of misfit dislocations, also referred to as threading dislocations, may be formed.

In general, the processes of the present disclosure may include forming a dislocation source layer in a semiconductor substrate, depositing a heterolayer on the substrate before or after formation of the dislocation source layer and radially distending the heterostructure to generate (i.e., "activate") dislocations and glide the dislocations from the dislocation source layer toward the surface layer. The activation of the source layer and the gliding of the dislocations from the source layer toward the interface with the deposited layer occur concurrently by applying a stress (e.g., tension) to the substrate. The stress may be applied in one or more steps and in various combinations to activate and glide the dislocations, thereby plastically stretching the heterostructure.

The heterolayer may have a crystal lattice constant, $a_{Sl}$, which differs from the native crystal lattice constant of the substrate, $a_S$, to form a film on the surface of the substrate. Generally, the crystal lattice constant, $a_{Sl}$, of the heterolayer is greater than the native crystal lattice constant of the substrate, $a_S$, such that by controlling the generating and gliding of the dislocation loops in the substrate by distention, the substrate may be plastically deformed and aligned more suitably with the crystal lattice of the film thereby allowing the film to be completely relaxed and having a reduced density of threading dislocations on the substrate.

The methods of the present disclosure have several advantages over conventional methods for relaxing heterolayers. Conventional methods create a large asymmetry in the stresses between the film and the substrate which leads to dislocation generation where the stresses are the greatest, i.e., the film. By confining the dislocation loops to the film, the dislocations leave segments behind which act as degrading threading dislocations. Much effort has been employed in attempting to minimize the density of such threading dislocations.

In contrast, methods of the present disclosure result in an asymmetry of stresses with the dislocation generation occurring in the substrate (e.g., by weakening the substrate and using a relatively thin film to void dislocation generation therein while weakening the substrate). This allows dislocations to be confined to the substrate while forming the misfit dislocation layer at the interface between the substrate and the film. Upon weakening the substrate by introducing dislocations in a variety of controlled ways, external stresses may be applied to the system to activate the dislocations. This differs from conventional methods which result in self-relaxation due to the relatively large intrinsic, internal stresses (i.e., relaxation without application of external stresses). The methods of the present disclosure involve relaxation other than by self-relaxation by weakening and application of external stress at appropriate temperatures with a relatively thin film such that self-relaxation does not occur.

I. Semiconductor Substrate

Figure 1:
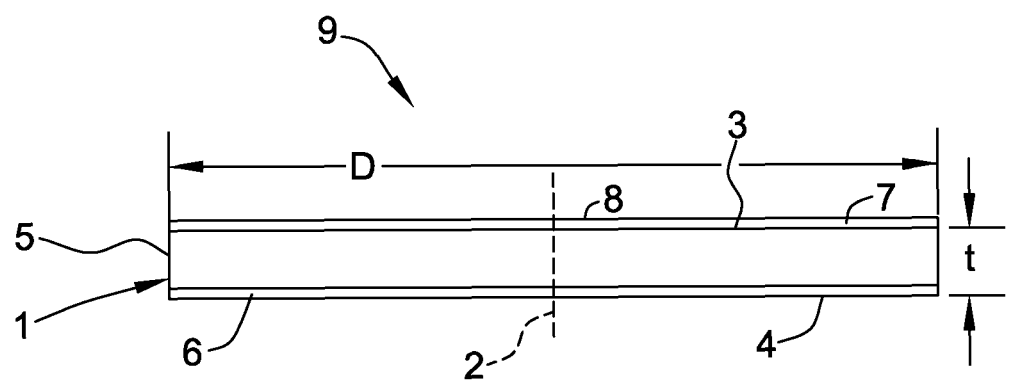
FIG. 1 is a cross-sectional, schematic drawing of a silicon heterostructure.

Referring to FIG. 1, the semiconductor substrate 1 may be any single crystal semiconductor material suitable for use as a substrate for supporting a surface layer such as by deposition of an epitaxial layer by chemical vapor deposition. In general, the semiconductor substrate may be composed of a material selected from the group consisting of silicon, silicon carbide, sapphire, germanium, silicon germanium, gallium nitride, aluminum nitride, gallium arsenic, indium gallium arsenic or any combination thereof. Typically, the semiconductor substrate is composed of silicon.

The semiconductor substrate 1 may be in any shape suitable for both use as a substrate for depositing a surface layer and suitable for applying a stress to the substrate material as described in more detail below. Typically, the semiconductor substrate has a central axis 2; an interface 3 with the deposited layer 7 and a back surface 4, the substrate-surface layer interface 3 and back surface 4 being generally perpendicular to the central axis 2; a thickness t, corresponding to the distance from the interface to the back surface of the substrate; a circumferential edge 5; and a diameter D, extending across the substrate through the central axis. It should be noted that, for illustrative purposes, the back surface 4 will be described as the opposing surface at or near which the dislocation source layer will be formed and as such may be referred to herein as the "opposing surface" and/or the "damaged surface." In this regard, the heterostructure itself and the deposited layer 7 described below are generally concentric with the substrate 1 and also include a central axis 2; a circumferential edge 5; and a diameter D, extending across the heterostructure (and also the surface layer) and through the central axis.

The substrate 1 may have any suitable diameter for use as a substrate upon which a semiconductor layer will be deposited. In general, the substrate 1 has diameter of about 150 mm or more. Typically, the substrate 1 has a diameter of about 200 mm or more, about 300 mm or more or even about 450 mm or more. It should be noted that the substrate diameter may be the diameter prior to plastically deforming the heterostructure, in which case, the diameter may increase from the stated values after plastic deformation as discussed in more detail below. Alternatively, the substrate prior to plastic deformation may have a diameter less than the stated values such that the diameter after plastic deformation is approximately equal to the stated values.

Similarly, the substrate 1 may have any thickness, t, suitable for use as a substrate upon which a semiconductor layer may be deposited. For example, the substrate may have a thickness, t, of from about 500 microns to about 1000 microns, typically from about 600 microns to about 1000 microns, from about 700 microns to about 1000 microns, from about 700 microns to about 900 microns or even from about 700 microns to about 800 microns.

In some embodiments, for example, the substrate 1 may be a single crystal silicon wafer that has been sliced from a single crystal silicon ingot grown by Czochralski crystal growing methods having a diameter of about 150 mm or more, about 200 mm or more, about 300 mm or more or even about 450 mm or more and a thickness of from about 675 microns to about 1000 microns or even from about 725 microns to about 925 microns.

The substrate surface upon which the epitaxial layer is deposited may be polished such that it is suitable for depositing the epitaxial layer or may be further conditioned prior to chemical vapor deposition. The opposing surface may also be polished or alternatively may be un-polished, i.e., as-ground, as-lapped or as-lapped and etched, without departing from the scope of the present disclosure. In various embodiments, the opposing surface may be left in an unpolished state, wherein the as-ground, as-lapped or as-lapped and etched surface may be utilized as a dislocation source layer. Alternatively or in addition, the opposing surface may be damaged to form a dislocation source layer as described in more detail below.

It should be noted that Czochralski-grown silicon typically has an oxygen concentration within the range of about $5 \times 10^{17}$ to about $9 \times 10^{17}$ atoms/cm$^3$ (ASTM standard F-121-83). In general, a single crystal silicon wafer used for a substrate in the present disclosure may have an oxygen concentration falling anywhere within or even outside the range typically attainable by the Czochralski process, provided the oxygen concentration is not so excessive as to prevent the activation and gliding of the dislocations.

II. Deposited Surface Layer

A surface layer 7 may be located on the front surface of the substrate 1. The deposited layer 7 may be any single crystal semiconductor material suitable for depositing as an epitaxial layer by chemical vapor deposition. Generally, the heterolayer includes a crystal lattice constant, $a_{SL}$, that is greater than the native crystal lattice constant of the substrate, $a_S$. The deposited layer may be composed of any suitable material and, as in some embodiments, is composed of a material selected from the group consisting of silicon, silicon carbide, sapphire, germanium, silicon germanium, gallium nitride, aluminum nitride, gallium arsenide, indium gallium arsenide or any combination thereof. In embodiments in which the substrate is composed of silicon, heterolayers with a greater lattice constant include, for example, germanium, silicon germanium, polytypes of silicon carbide, gallium arsenide and indium gallium arsenide.

In one preferred embodiment, the deposited layer is silicon germanium, also referred to herein as SiGe. The specific composition of the deposited SiGe layer may vary without departing from the scope of the present disclosure. Typically, the SiGe layer comprises at least about 10% Ge, and in some instances may comprise about 15%, about 20%, about 25%, about 35%, about 50% Ge or more (e.g., 60%, 70%, 80%, 90% or more). In one preferred embodiment, however, the SiGe layer has a Ge concentration in the range of at least about 10% to less than about 50%, or from at least about 15% to less than about 35%, with a concentration of about 20% Ge being preferred.

Essentially any technique generally known in the art may be used to form the deposited layer (e.g., SiGe layer), such as one of the known epitaxial deposition techniques. Generally speaking, the thickness of the deposited layer may vary greatly without departing from the scope of the present disclosure. The thickness may have, for example, a substantially uniform thickness, the average thickness thereof being at least about 0.1 microns, at least about 0.5 microns, at least about 1.0 micron, and even at least about 2.0 microns. Alternatively, it may be desirable to express thickness in terms of a range. For example, the average thickness may typically be in the range of from about 0.1 microns to about 2.0 microns, such as from about 0.5 micron to about 1.0 micron.

It should be noted that as the deposited layer is grown on a substrate having a differing lattice constant, an equal, but opposite stress is formed in both the deposited layer and the substrate. The relative amount of stress in the deposited layer and the substrate, just above and just below the interface, is proportional to the relative thicknesses of the deposited layer and the substrate. As a result, the stress in the deposited layer just above the interface may be several orders of magnitude larger than the stress in the substrate just below the interface. For example, if a 500 nm SiGe layer comprising about 22% Ge is grown on a 700 micron thick silicon semiconductor substrate, the SiGe just above the interface will be under approximately 1.7 GPa of compression and the silicon just below the interface will be under only 5 MPa of tension. The stress in the deposited layer can increase during growth until the layer self-relaxes by forming misfit or threading dislocations in the deposited layer. To avoid self-relaxation of the deposited layer, therefore, it is preferable at least initially to grow a thin deposited layer on the substrate. Typically, the deposited layer will be grown to a thickness of from about 1 nm to about 100 nm, more typically from about 1 nm to about 50 nm, still more typically from about 10 nm to about 20 nm in the case of a SiGe layer being deposited on a single crystal silicon substrate. The thin layer may then be relaxed or partially relaxed to at or near its native lattice constant by activating and expanding dislocations in the substrate as discussed in more detail below. If a thicker deposited layer is desired, additional material may be deposited after the layer has been sufficiently relaxed.

Essentially any technique generally known in the art may be used to form a deposited layer on the substrate. For example, epitaxial deposition techniques (e.g., atmospheric-pressure chemical vapor phase deposition (APCVD); low- or reduced-pressure CVD (LPCVD); ultra-high-vacuum CVD (UHVCVD); molecular beam epitaxy (MBE); or, atomic layer deposition (ALD)) may be used wherein, for example, SiGe material is deposited. The epitaxial growth system may comprise a single-wafer or a multiple-wafer batch reactor.

The surface layer 7 includes a surface which forms the front surface 8 of the heterostructure. The surface layer 7 may continuously extend across the entire diameter of the substrate 1 as shown in FIG. 1. In some embodiments, the surface layer 7 does not extend continuously over the substrate 1 but rather includes a number of discontinuous segments or "islands" of semiconductor material that are disposed on the substrate as further described below. For example, the surface layer may be disposed over less than about 95% of the substrate or, as in other embodiments, less than about 80%, less than about 60%, less than about 40% or less than about 20% of the substrate.

III. Preparation of a Dislocation Source Layer

A dislocation source layer 6 is located within the substrate 1 and may be spaced from the substrate surface upon which the epitaxial layer is to be deposited. Typically, the dislocation source layer 6 is at or near the surface opposing the surface upon which the epitaxial layer has been or will be deposited. For example, if the epitaxial layer is to be deposited on the front surface of the substrate, the dislocation source layer 6 will be at or near the back surface 4 of the substrate. In such an example, the front surface of the substrate will become the interface between the substrate and the deposited layer 7.

The source layer 6 is present or is installed over a substantial radial width of the substrate 1. In the embodiment illustrated in FIG. 1, the source layer 6 extends across the entire diameter of the substrate 1. Although this embodiment is preferred, in other embodiments the source layer may not extend over the entire diameter. In general, therefore, source layer 6 will have a radial width of typically at least about 75%, more typically at least about 85% and still more typically at least about 95% of the radius of the wafer or even at least about 99% of the radius of the wafer. In some embodiments, the source layer 6 extends to within a few millimeters of the circumferential edge, for example, to within about 1 mm of the circumferential edge.

In general, the source layer 6 may include any portion of the substrate provided the source layer does not include the surface upon which the epitaxial layer is to be deposited. Generally the source layer 6 has a thickness of about 100 microns or less, about 50 microns or less, about 25 microns or less or about 10 microns or less (e.g., from about 1 micron to about 100 microns, from about 1 micron to about 50 microns, from about 1 micron to about 25 microns or from about 5 microns to about 25 microns). The source layer 6 may include the back surface of the substrate and extend therefrom. It should be noted that the source layer 6 need not include the back surface of the wafer and may extend from a depth from the back surface toward the front surface of the substrate.

The dislocation source layer 6 may be any layer capable of generating a measurable concentration of dislocations when subjected to sufficiently high stresses at sufficiently high temperatures. In general, the dislocation source layer 6 is capable of generating a measurable concentration of dislocations when subjected to tension of between about 5 MPa and about 100 MPa (typically at around about 15 MPa at temperatures of between about 500° C. and about 1000° C.) as discussed in more detail below with regard to the activation of dislocations within the substrate.

The dislocation source layer 6 may be formed in the substrate 1 before or subsequent to the deposition of the surface layer 7. In embodiments wherein the substrate is a wafer sliced from a single crystal ingot, the dislocation source layer 6 may be mechanical damage caused by the slicing process, grinding process or lapping process included as part of the overall wafering process.

Alternatively or in addition, the dislocation source layer 6 may be formed in part or in its entirety by mechanically damaging the back surface of the substrate by one or more processes selected from the group consisting of: grinding the back surface, lapping the back surface, installing soft damage by sandblasting the back surface, forming indentations on the back surface, implanting ions in the back surface and/or combinations thereof.

In some embodiments, the dislocation source layer 6 may be formed by pressing an array of pointed pins onto the wafer back surface to form indentations in the back surface. The indentations may be formed non-uniformly across the surface or may be formed in a predetermined pattern. Such a pattern may be arranged in a specific relation to the wafer crystal directions. For example, a square matrix pattern could be arranged at a shallow angle to the 110 direction. This may allow for the dislocations generated at these sites to glide along parallel glide planes and not interact with each other. Furthermore, accurate control of the dislocation loop density may be had by such a treatment.

In some embodiments, the source layer 6 may be formed by implanting ions through the back surface of the substrate. The implanted ions may be electrically isoelectronic, neutral, or inert to minimize any effect upon the electronic properties of the substrate. For example, the implanted ions may be selected from the group consisting of silicon, germanium, hydrogen, helium, neon, argon, xenon, and combinations thereof.

The ions are implanted to a target depth, $D_i$, relative to the back surface. As a practical matter, however, some of the implanted ions will not travel this distance and others will travel an even greater distance (i.e., reach a greater depth relative to the back surface). The actual ion implantation depth may vary from $D_i$ by about 5%, 10%, 15%, 20%, 25%, or more. This creates a zone or layer of amorphous material containing a relatively high concentration of implanted ions at or near $D_i$, with the concentration of implanted ions decreasing from $D_i$ in the direction of front surface 3 and in the opposite direction. Target depth, $D_i$, may also be referred to as the projected range of the implanted ions.

Implantation depth may be affected, at least in part, by the ionic species implanted, since lighter ions tend to penetrate further into the substrate for a given implantation energy. Thus, for example, at an implant energy of 50 keV, silicon ions will have an average implant depth of about 750 Å, whereas germanium ions will have an average implant depth of 400 Å. In general, ions are preferably implanted at an energy of at least about 30 keV, such as at least about 40 keV, or even at least about 50 keV. In one application, ions are implanted at an energy of at least about 45 keV and less than about 55 keV. The ion and the implant energy selected should be sufficient to form an amorphous layer in the substrate which acts as the dislocation source layer.

Generally, dislocation loops form at the end of range of the implanted ions upon subsequent anneal if sufficient energy is used to implant a sufficient concentration of ions to form an amorphous layer of silicon. Typically, the dislocation loops may form at a depth of about 100 Å to about 300 Å below the implanted ions, although the exact depth may be more or less. In general, it is more difficult to form amorphous material using lower mass elements. Accordingly, a much higher concentration of low mass elements must be used to induce sufficient damage, whereas lower concentrations of high mass elements are sufficient to form amorphous silicon. For example, when the implanted ions are silicon ions, the implanted dose is preferably at least about $2 \times 10^{14}$ atoms/cm², such as at least about $5 \times 10^{14}$ atoms/cm², or even at least about $1 \times 10^{15}$ atoms/cm². In one preferred embodiment, the implanted ion dose is at least about $2 \times 10^{15}$ atoms/cm². By comparison, when the implanted ions are the higher mass germanium ions, the implanted dose is preferably at least about $6 \times 10^{13}$ atoms/cm², such as at least about $1 \times 10^{14}$ atoms/cm², or even at least about $5 \times 10^{14}$ atoms/cm². In one preferred embodiment, the implanted ion dose is at least about $1 \times 10^{15}$ atoms/cm².

In some preferred embodiments, the source layer 6 is formed by grinding the back surface of the substrate. The surface may be ground using any grinding processes typically used in the semiconductor silicon industry to shape the surface of a silicon wafer after being sliced from a Czochralski-grown single crystal silicon ingot. In a particularly preferred embodiment, the back surface may be ground using a grinding process which uses a grit size of about 600.

IV. Activating and Gliding of the Dislocations

The dislocation source layer may be activated to form dislocations at or near the source layer which may be glided toward the substrate-surface layer interface. In accordance with embodiments of the present disclosure, activation and gliding of dislocations is performed after the surface layer has been deposited on the substrate such that the substrate and/or surface layer are under strain.

The dislocation source layer is activated by subjecting the dislocation source layer (and typically subjecting the substrate) to a stress by distending (which may be also be referred to herein as "stretching," "tension" or "tensile stress") the substrate at an elevated temperature to cause the formation of dislocations. Distension is applied to the entire substrate in a direction perpendicular to the axis, i.e., in the radial direction using one or more suitable apparatus. That is, the wafer is stretched radially outward from the peripheral edge. In this manner, the dislocations will form at or near the source layer and the dislocations will glide towards the opposite surface.

In general, more heavily damaged dislocation source layers will activate at lower stress levels and at lower temperatures whereas less heavily damaged dislocation source layers will activate at higher stress levels and temperatures. In general, stress applied by tension of at least about 5 MPa, typically from about 5 MPa to about 100 MPa or from about 10 MPa to about 100 MPa is applied to the dislocation source layer at a temperature of between about 550° C. and about 1000° C. More typically, the tension is from about 10 MPa to about 50 MPa or from about 10 MPa to about 25 MPa. Typically, the activation and/or gliding of the dislocations is carried out at temperatures from about 650° C. to about 1000° C. or even from about 700° C. to about 1000° C. For example, typical stresses that may be applied to activate a dislocation source layer formed by lapping and/or grinding may be about 15 MPa at temperatures greater than about 600° C. and even more typically at temperatures greater than about 700° C. Other, more highly damaged layers may activate at even lower stress levels.

The substrate is maintained under tension at an elevated temperature for duration sufficient to activate and glide dislocations. In general, the substrate is maintained under tension and at an elevated temperature, as described above, for a period of at least about 10 seconds and may be maintained under those conditions for a period of at least about 5 hours, at least about 10 hours or even longer. Typically, the substrate is maintained under tension at an elevated temperature for a period of at least about 1 minute, from about 5 minutes to about 60 minutes, more typically from about 10 minutes to about 45 minutes and in some embodiments may be from about 10 minutes to about 20 minutes. It should be noted that the higher tension levels and higher temperatures each tend to reduce the duration required to activate and glide the dislocations.

Distension may be applied to the substrate alone or, as in other embodiments, may be applied to the entire heterostructure (i.e., both the substrate and heterolayer). Further, it is preferred that the stress applied by distension be relatively uniform (in direction and/or magnitude) throughout the heterostructure (e.g., both radially and circumferentially). It should be noted that the degree of uniformity of stress may be limited by the apparatus used to distend the substrate and some variation (radial or circumferential variation) may result from uneven distribution of stress. In some embodiments, at least about 5 MPa of stress is applied along the entire circumference of the substrate or, as in other embodiments, at least about 10 MPa of stress is applied along the entire circumference of the substrate.

Upon application of sufficient stress, dislocations continually form at the dislocation source layer and glide toward the substrate-surface layer interface. At a given point of time during application of stress, the dislocations may generally be uniformly distributed throughout the thickness of the substrate. Upon reaching the substrate-surface layer interface, the dislocations form misfit interfacial dislocations at the interface. The misfit dislocations increase in density at the interface during distension of the substrate and continue to relax the strain between the surface layer and the substrate. The strain is eventually balanced upon a build-up of sufficient density of misfits.

The dislocations that are generated from the dislocation source layer and which glide toward the substrate-surface layer interface may be substantially parallel to the back and front surfaces of the heterostructure (i.e., are arranged laterally). It is believed that a relatively small amount or even no threading dislocations are generated from the dislocation source layer.

It is preferred that the distension of the substrate cease at or near the point at which the strain is balanced as further generation and gliding of dislocations may cause dislocations to penetrate the surface layer. Once distension of the substrate is stopped, the dislocations in transit in the substrate cease to glide to the interface and no further dislocations are generated (i.e., dislocations become frozen-in).

The number of dislocations that may be present in the substrate at any given point of application of stress and heat may be at least about $1 \times 10^5$ dislocations/cm$^2$ or even at least about $5 \times 10^5$ dislocations/cm$^2$ (e.g., from about $1 \times 10^5$ dislocations/cm$^2$ to about $5 \times 10^7$ dislocations/cm$^2$ or from about $5 \times 10^5$ dislocations/cm$^2$ to about $1 \times 10^7$ dislocations/cm$^2$). The number density of the dislocations may be determined using any dislocation loop detection method including, for example, sampling the substrate and subjecting the sample to a delineating etchant prior to viewing and counting the dislocation loops through a microscope.

In some embodiments, the stress applied to the substrate by distension of the substrate is reduced to a value less than a threshold value at which dislocations are generated from the dislocation source layer but at a sufficient magnitude to allow the existing dislocations to glide further upwards toward the interface. In this manner, a heterostructure having a substrate substantially free of dislocations may be produced. In such embodiments, an initial stress $S_1$ may be applied to the substrate by distension of the substrate to generate and glide dislocations from the source layer to the substrate-surface layer interface. The applied stress is then lowered to $S_2$ (i.e., $S_2$ is less than $S_1$). The stress $S_2$ is a stress less than a threshold value at which dislocations are generated from the dislocation source layer and which allows the existing dislocations to glide further upwards toward the interface to produce a substrate substantially free of dislocations. $S_1$ may be at least about 5 MPa, at least about 10 MPa or at least about 25 MPa (e.g., from about 5 MPa to about 100 MPa or from about 10 MPa to about 100 MPa). $S_2$ may be less than about 10 MPa, less than about 5 MPa or even less than about 1 MPa. Typically, even at stresses on the order of about 1 MPa, the dislocations will glide at a velocity of about 1 micron per second at a temperature of about 850° C. or about 2.5 microns per second at a temperature of about 900° C.

The magnitude of stress, the time of application of stress and/or the temperature at which stress is applied to the substrate may be varied depending on the difference between the lattice constant, $a_S$, of the substrate and the lattice constant, $a_{SL}$, of the semiconductor material of the surface layer. Depending on the substrate material chosen and the semiconductor material deposited thereon, $a_{SL}$ and $a_S$ may vary. In general, distension is effective to relax the heterolayer when $a_{SL}$ is greater than $a_S$, i.e., when the ratio $a_{SL}/a_S$ is greater than 1. The ratio $a_{SL}/a_S$ may be from about 1.01 to about 1.16 or, as in other embodiments, from about 1.01 to about 1.10, from about 1.01 to about 1.08, from about 1.01 to about 1.05, from about 1.02 to about 1.16 or from about 1.05 to about 1.16.

By gliding the dislocations to the interface, the surface layer may be at least about 85% relaxed, at least about 90% relaxed, at least about 95% relaxed or even completely relaxed, i.e., 100% relaxed. The surface layer may be substantially free of threading dislocations or may have a concentration of threading dislocations of less than about $10^4$ threading dislocations/cm².

In embodiments in which the surface layer is not continuous but includes discontinuous segments (i.e., islands) disposed on the surface of the substrate, the discontinuous segments become relaxed by generating and gliding dislocations from the dislocation source layer to the interface with the islands to create misfit interfacial dislocations between each island and the substrate. Dislocations which reach the surface of the substrate between islands dissipate at the surface which allows the area between islands to be substantially free of dislocations upon completion of distension. After relaxation of the islands, semiconductor material may be further deposited to produce a surface layer that continuously extends over the entire diameter of the substrate. In such embodiments, the dislocations below the islands propagate laterally at the interface between the newly deposited material and the substrate thereby relaxing the newly deposited material and the continuous surface layer as a whole.

The relaxed heterostructure fabricated by any of the methods described above may be used to fabricate silicon-on-insulator structures for integrated circuits using wafer bonding and layer transfer methods, or to subsequently fabricate strained silicon-on-insulator structures.

Additional layers may be deposited on the relaxed surface layer thereby forming heteroepitaxial structures having a strained layer on top of the relaxed layer on top of a substrate. Such a structure may also be used to transfer both the relaxed layer and strained layer to another substrate, thereby forming a heteroepitaxial structure having a buried strained layer or alternatively a buried strained layer on insulator. That is, the heteroepitaxial structure may have a relaxed layer of semiconductor material on top of a strained layer of semiconductor material on top of either a substrate or an insulating layer on a substrate.

In addition, the structures fabricated by the methods of the present disclosure may be used to fabricate semiconductor devices such as field effect transistor (FET) or modulation-doped field effect transistor (MODFET) layer structures. Relaxed SiGe layers can also be used for a variety of other applications, such as thermoelectric cooling devices.

V. Apparatus for Distension

In this regard, the processes described herein relating to distension of the substrate may be performed with use of any of the apparatus described below.

Referring now to FIGS. 3-15, distension of the substrate may be achieved by use of a substrate holder that includes chambers and/or fluid passageways for applying a differential pressure across the substrate.

Figure 3:
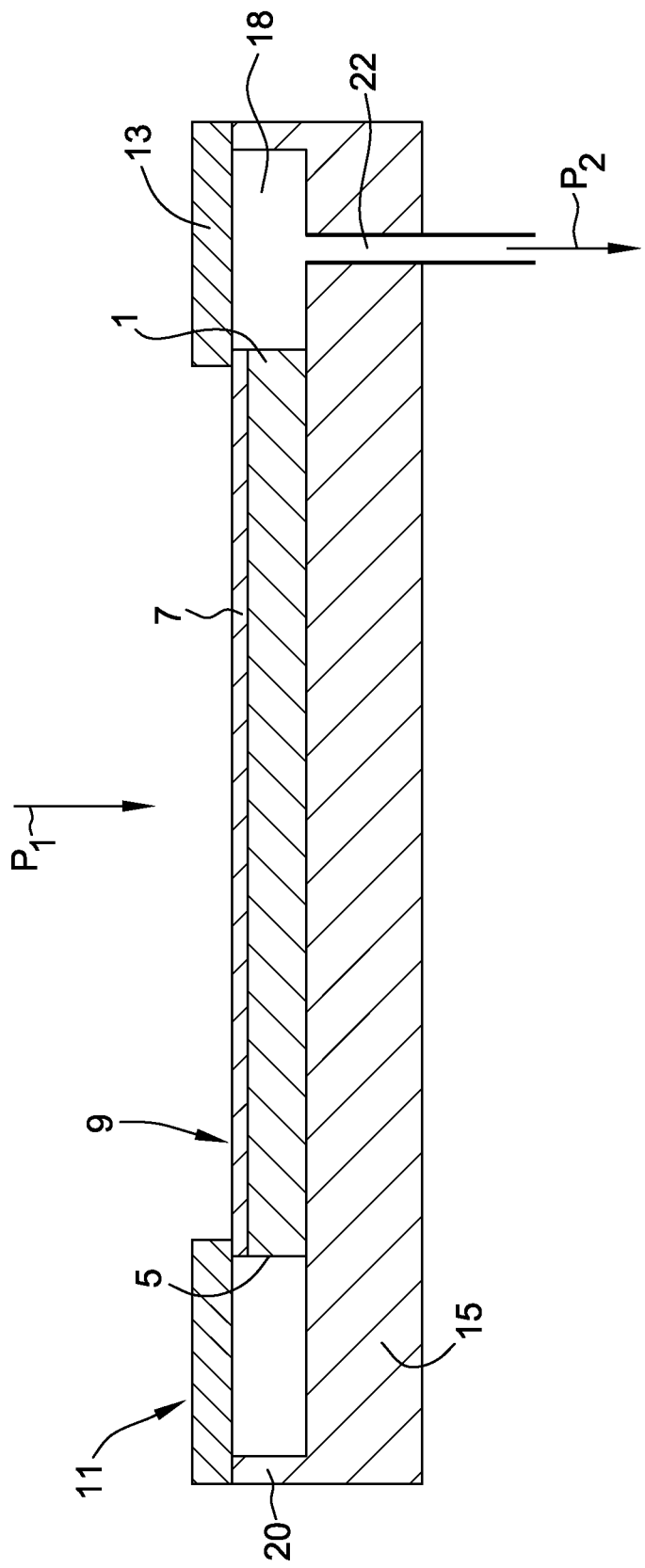
FIGS. 3-4 are cross-sectional views of a semiconductor structure and a structure holder for distending the semiconductor structure.
Figure 4:
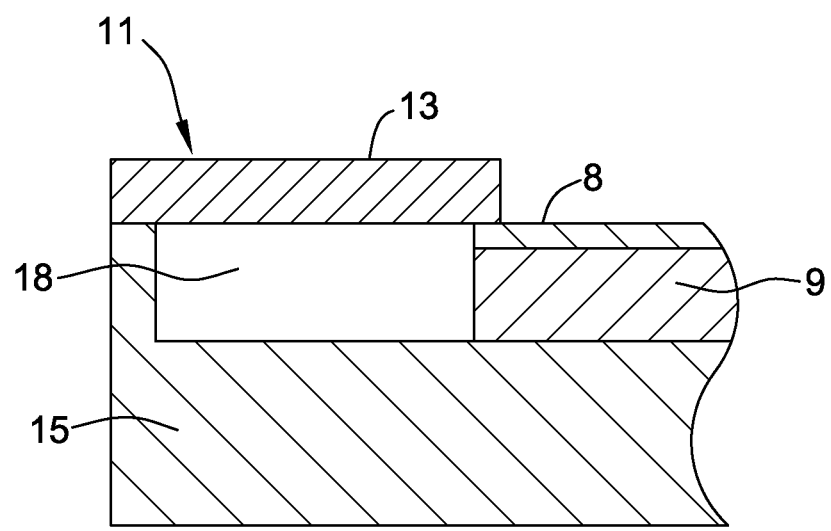

Referring now to FIGS. 3-4, distension of the structure 9 is achieved by use of structure holder 11. The structure holder 11 includes a top plate 13. As shown in FIGS. 3-4, the top plate 13 is a ring. The top plate 13 may have other shapes and may extend entirely across the substrate 9 without limitation. The top plate 13 is adapted to contact the front surface of the structure 9 at the circumferential edge 5 of the structure.

The structure holder 11 includes a back plate 15 for contacting the back surface of the structure 9 adjacent the circumferential edge 5. The back plate 15 includes a peripheral ring 20 that extends upward toward the top plate 13. However in other embodiments, the peripheral ring 20 may be part of the top plate 13 or may be separate from both the top plate 13 and back plate 15. The back plate 15, top plate 13 and peripheral ring 20 are both adapted to form a peripheral chamber 18 between the top plate 13, back plate 15 (including the peripheral ring) and circumferential edge 5 of the structure 9. Generally, the back plate 15 and top plate 13 form a seal with the structure 9 which allows the pressure in the peripheral chamber 18 to be decreased relative to the pressure exterior to the holder 11 as described below. The peripheral chamber 18 may be formed by positioning the semiconductor structure 9 on the back plate 15 and lowering the top plate 13 onto the back plate 15 until a seal is formed between the top plate 13, back plate 15 and circumferential edge 5 of the structure 9.

The holder 11 includes a vent 22 in the back plate 15 for adjusting the pressure in the peripheral chamber 18. Alternatively, the vent may extend through the front plate 13 and/or peripheral ring 20. The vent 22 may be in fluid communication with a pump (not shown) for decreasing the pressure in the peripheral chamber 18.

Figure 8:
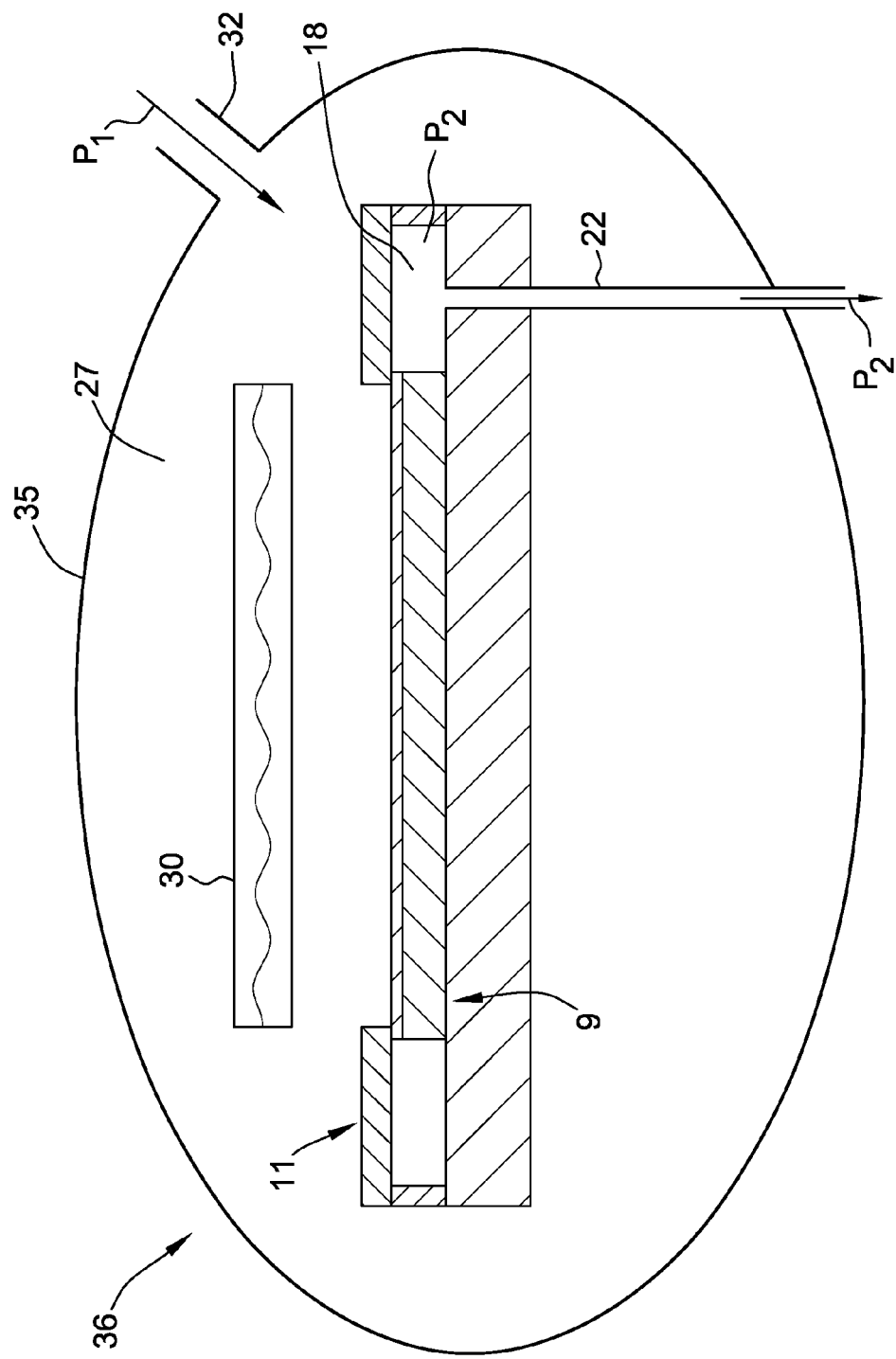
FIG. 8 is a cross-sectional schematic view of an semiconductor structure and an apparatus for distending the structure with the structure holder of FIG. 3 mounted therein.

Referring now to FIG. 8, the holder 11 may be part of an apparatus 36 for distending a structure 9. The apparatus 36 may also include a housing 35 which defines a main chamber 27 in which the holder 11 is mounted. The apparatus 36 may include a vent 32 that is in fluid communication with a pump (not shown) for regulating the pressure $P_1$ in the main chamber. The vent 22 within the structure holder 11 extends through the housing 35. In this manner, a pressure $P_1$ may be maintained in the main chamber 27 and a different pressure, $P_2$, may be maintained in the peripheral chamber 18 of the structure holder 11. By maintaining the pressure $P_1$ in the main chamber 27 greater than the pressure $P_2$ in the peripheral chamber 18, the structure 9 may be distended (i.e., the radius of the substrate may be increased).

In this regard, the arrows associated with pressures $P_1$ and/or $P_2$ in FIGS. 3-15 are provided for exemplification purposes and should not be considered to limit the apparatus to a particular pressure profile (i.e., use of a vacuum or pressure in the peripheral chamber or main chamber).

During distension of the structure 9, $P_1$ may be at least about 10 MPa greater than $P_2$ or, as in other embodiments, at least about 20 MPa, at least about 50 MPa or at least about 75 MPa greater than $P_2$ (e.g., from about 10 MPa to about 100 MPa, from about 10 MPa to about 50 MPa or from about 10 MPa to about 25 MPa). In some embodiments, $P_1$ is ambient pressure. In such embodiments, the main chamber 27 and housing 35 may be eliminated and the housing may be exposed to the ambient environment (i.e., atmospheric pressure).

A heating element 30 may be used to heat the structure 9 during distension to activate the dislocation source layer. As described above, the structure may be heated to a temperature of from about 650° C. to about 1000° C. or from about 700° C. to about 1000° C.

Figure 5:
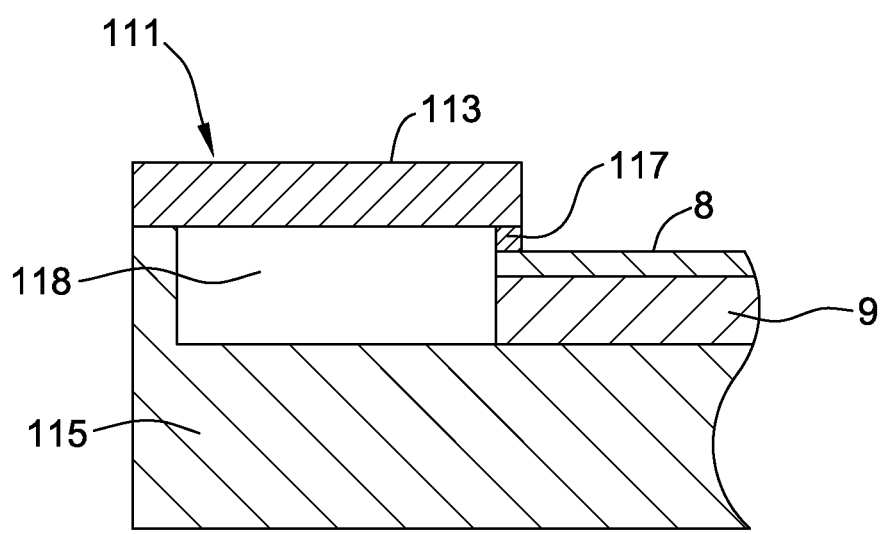
FIG. 5 is a cross-sectional view of a semiconductor structure and another embodiment of a structure holder for distending the semiconductor structure.

Another embodiment of the structure holder 111 is shown in FIG. 5. It should be noted that the holder components shown in FIG. 5 that are analogous to those of FIG. 3 are designated by the corresponding reference number of FIG. 3 plus "100" (e.g., part 15 becomes part 115). As shown in FIG. 5, the top plate 113 includes a projection 117 for contacting the front surface 8 of the structure 9. The projection 117 may form a seal with the structure 9 to allow the pressure in the peripheral chamber 118 to be increased or decreased.

Figure 6:
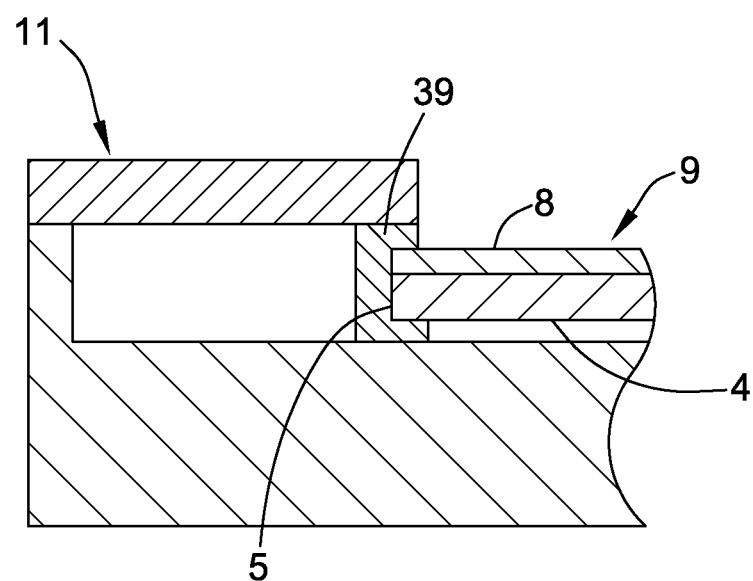
FIGS. 6-7 are cross-sectional views of a semiconductor structure having a coating thereon and the structure holder of FIG. 3.
Figure 7:
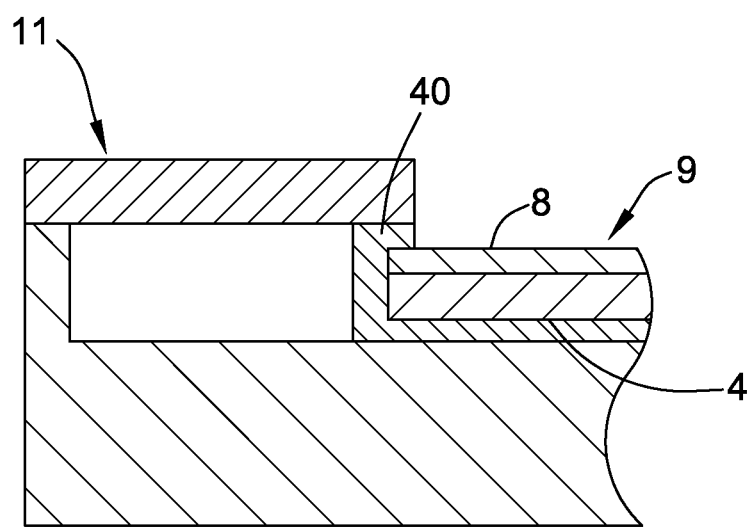

In some embodiments and as shown in FIGS. 6-7, the structure 9 has a coating 39 (FIG. 6) or coating 40 (FIG. 7) on at least a portion of the structure surfaces. As shown in FIG. 6, the coating 39 extends over the circumferential edge 5 of the structure 9 and a portion of the front surface 8 and back surface 4 near the peripheral edge 5. As shown in FIG. 7, the coating 40 also extends over the entire back surface 4 of the structure. Alternatively or in addition, a coating may extend over one or more surfaces of the structure holder. The coating 39 or coating 40 (or coatings which may extend over the structure holder) may be composed of a low-friction material such as graphite, hexagonal boron nitride, $MS_2$, $WS_2$, SiCN, AlCr(V)N, TiAl(Y)N, $CaF_2$, $BaF_2$, $SrF_2$ or $BaCrO_4$. In some embodiments, the structure 9 has a coating on the front surface of the structure that reduces or even prevents evaporation of volatile film components of the structure. Suitable coatings for reducing evaporation include amorphous silicon.

Figure 9:
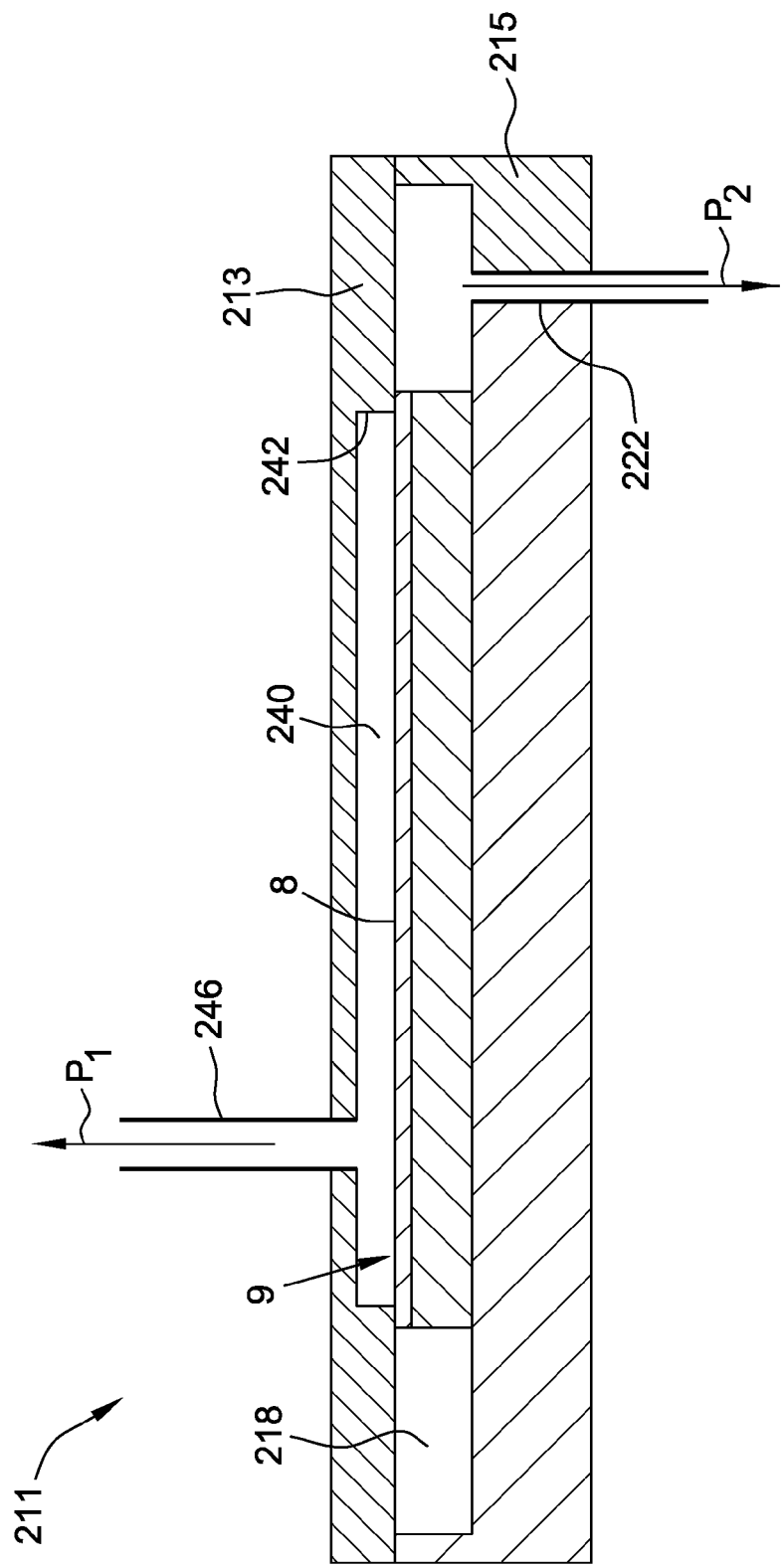
FIG. 9 is a cross-sectional view of a semiconductor structure and another embodiment of a structure holder for distending the semiconductor structure.
Figure 10:
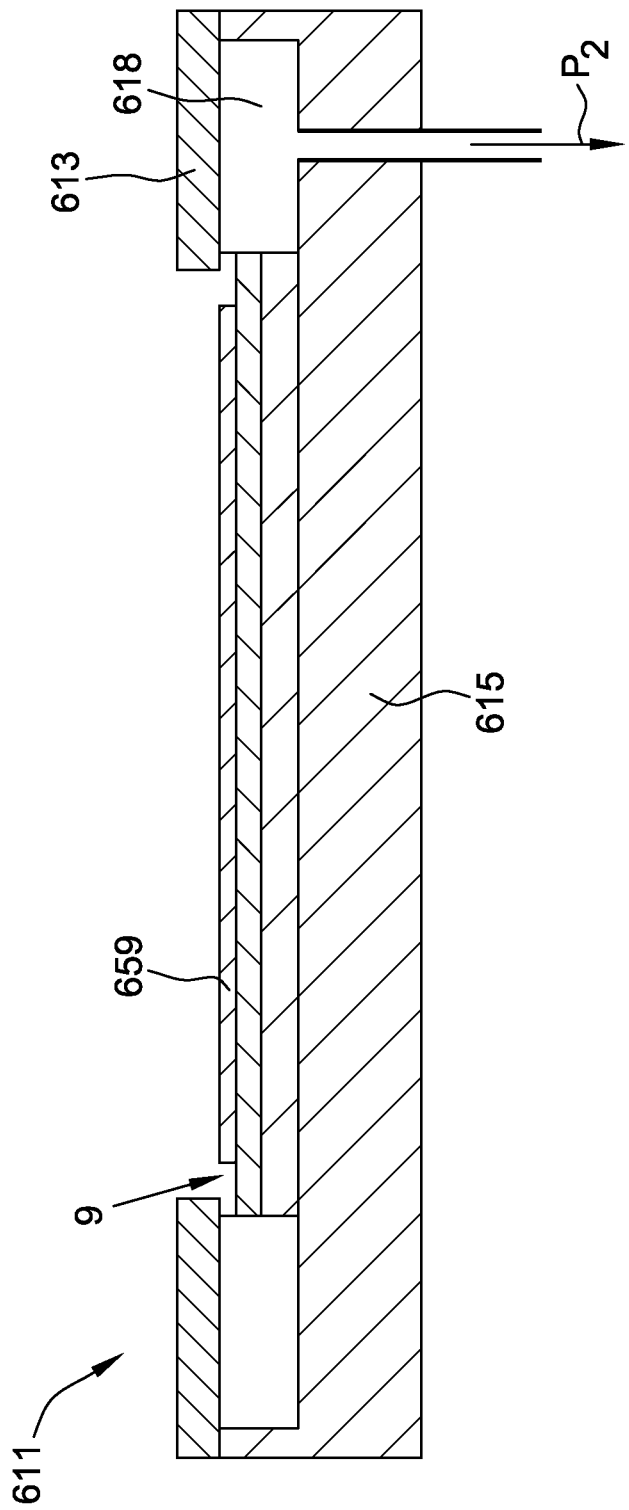
FIG. 10 is a cross-sectional view of a semiconductor structure and a structure holder having a compression plate for distending the semiconductor structure.

Another embodiment of the structure holder 211 is shown in FIG. 9. It should be noted that the holder components shown in FIG. 9 that are analogous to those of FIG. 3 are designated by the corresponding reference number of FIG. 3 plus "200" (e.g., part 15 becomes part 215). The top plate 213 of the structure holder 211 includes a recess adapted for forming a central chamber 240 between the top plate 213 and the front surface 8 of the structure 9 during use of the structure holder 211. The central chamber 240 is formed by lowering the top plate 213 onto the semiconductor structure 9. The recess is defined by an annular wall 242. The recess has a radius that is less than the strained radius of the structure. As used herein, "strained radius" refers to the radius of the structure prior to radial distension (deformation) of the structure 9 by use of the structure holder 211.

The top plate 213 includes a vent 246 that is in fluid communication with a pump (not shown) to maintain a pressure $P_1$ in the central chamber 240. In this manner a differential pressure may be maintained between the central chamber 240 and peripheral chamber 218 to cause the structure 9 to be radially distended. By maintaining the pressure $P_1$ in the central chamber 240 greater than pressure $P_2$ in the peripheral chamber 218, the structure may be distended. Pressures $P_1$ and/or $P_2$ may be within the ranges described above.

Figure 11:
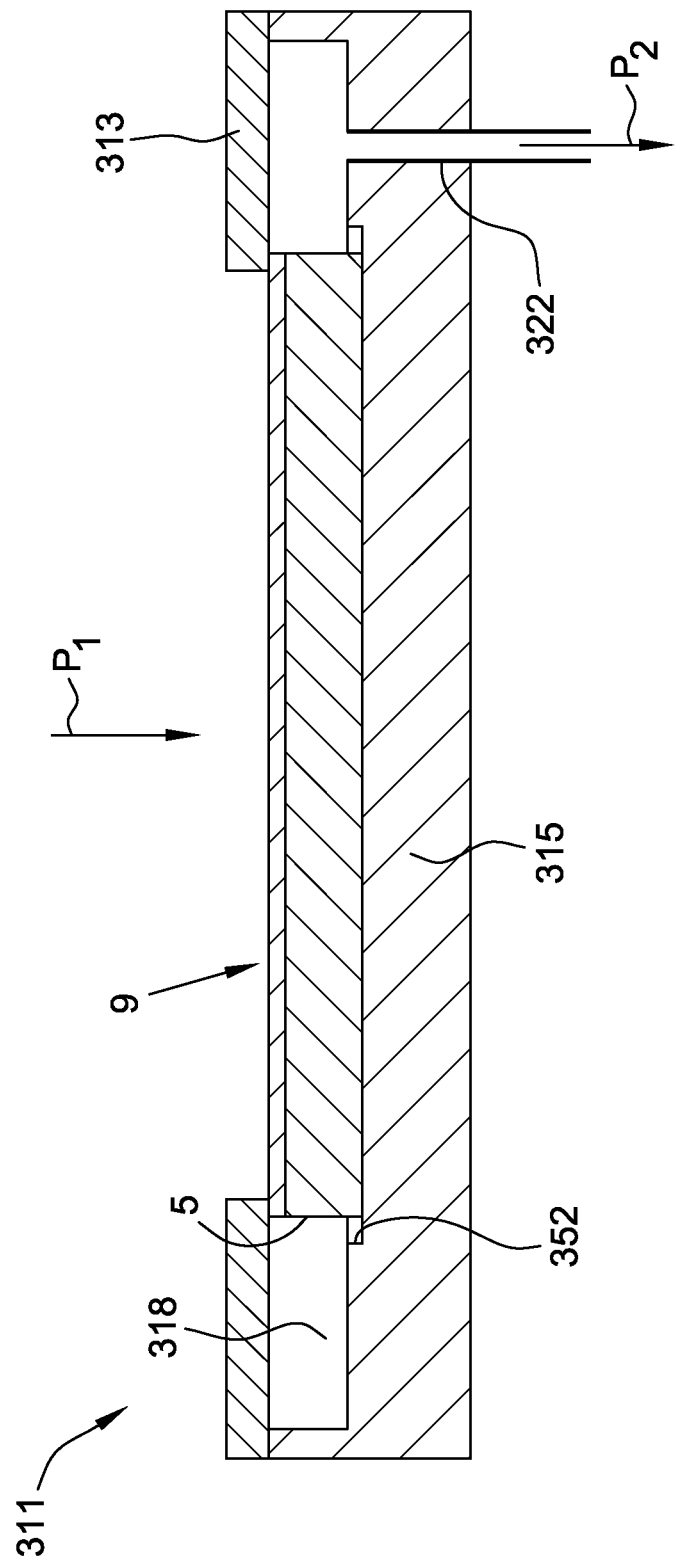
FIG. 11 is a cross-sectional view of a semiconductor structure and another embodiment of a structure holder for distending the semiconductor structure.

An embodiment of a self-limiting structure holder for radially distending the structure is shown in FIG. 11. The holder components shown in FIG. 11 that are analogous to those of FIG. 3 are designated by the corresponding reference number of FIG. 3 plus "300". The back plate 315 of the structure holder 311 includes a recess that is defined by an annular wall 352 adapted to limit the expansion of the structure during distension of the structure. The radius of the recess of the back plate 315 is greater than the strained radius of the structure. During distension, the radius of the structure 9 increases until the structure contacts the annular wall 352. Upon contacting the annular wall 352, distension of the structure 9 ceases.

Figure 12:
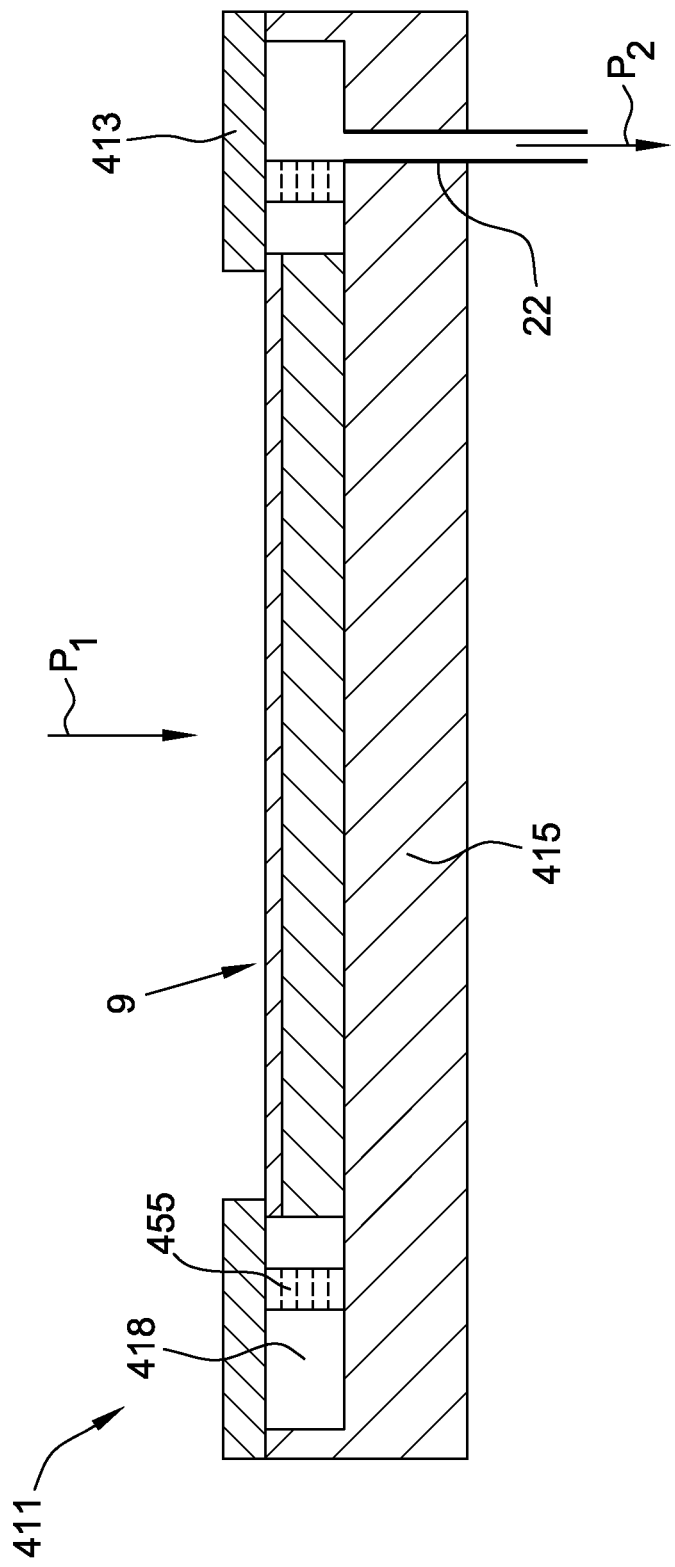
FIG. 12 is a cross-sectional view of a semiconductor structure and another embodiment of a structure holder for distending the semiconductor structure.

Another embodiment of a self-limiting structure holder for radially distending the structure 9 is shown in FIG. 12. The holder components shown in FIG. 12 that are analogous to those of FIG. 3 are designated by the corresponding reference number of FIG. 3 plus "400". The holder 411 includes a perforated wall 455 in the peripheral chamber 418 that is adapted to limit the expansion of the structure during distension of the structure 9. The perforations formed in the wall 455 allow pressure to equilibrate through the peripheral chamber 418. The peripheral wall 455 limits the distension of the structure 9 during radial distension.

Figure 13:
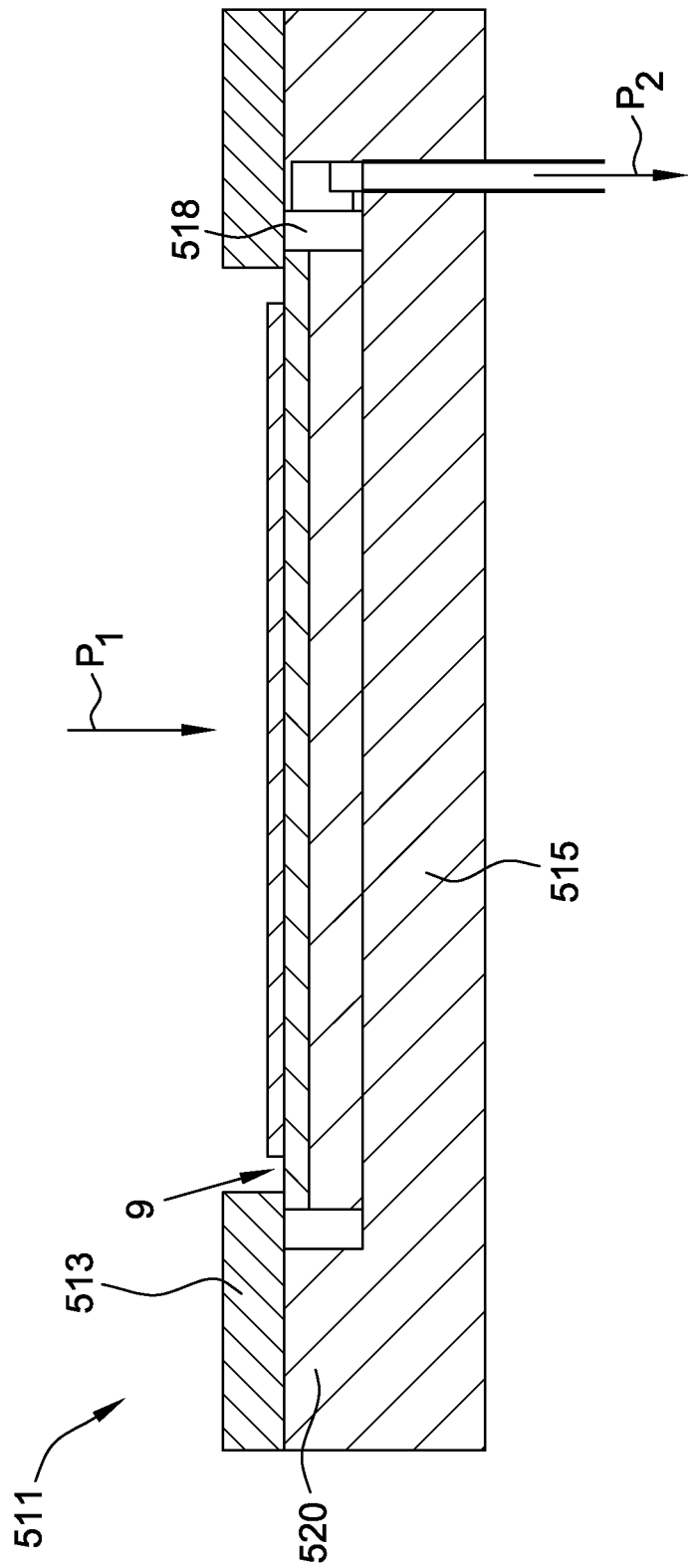
FIG. 13 is a cross-sectional view of a semiconductor structure and a structure holder having a compression plate for distending the semiconductor structure.

Another embodiment of a self-limiting structure holder for radially distending the structure is shown in FIG. 13. The holder components shown in FIG. 13 that are analogous to those of FIG. 3 are designated by the corresponding reference number of FIG. 3 plus "500". The peripheral ring 520 of the back plate 515 of the structure holder 511 extends relatively close to the relaxed structure before use. During distension, the structure 9 expands radially until the structure 9 contacts the peripheral ring 520 to limit the distension of the structure.

To distend (i.e., stretch) the structure 9, alternatively or in addition to use of a higher pressure in the main chamber, a compression plate 659 (FIG. 10) may be used to apply downward pressure $P_1$ of the structure. The holder components shown in FIG. 10 that are analogous to those of FIG. 3 are designated by the corresponding reference number of FIG. 3 plus "600". A pressure $P_2$ is maintained in the peripheral chamber 618. $P_2$ is less than $P_1$ to maintain a differential pressure to distend the structure 9. As described above, $P_1$ may be at least about 10 MPa greater than $P_2$ or, as in other embodiments, at least about 20 MPa, at least about 50 MPa or at least about 75 MPa greater than $P_2$ (e.g., from about 10 MPa to about 100 MPa, from about 10 MPa to about 50 MPa or from about 10 MPa to about 25 MPa). Force may be applied through the compression plate 659 to the structure 9 by any suitable method such as by use of hydraulics, pneumatics or electric drives. The self-limiting features described above may be used in combination with the compression plate 659.

Figure 14:
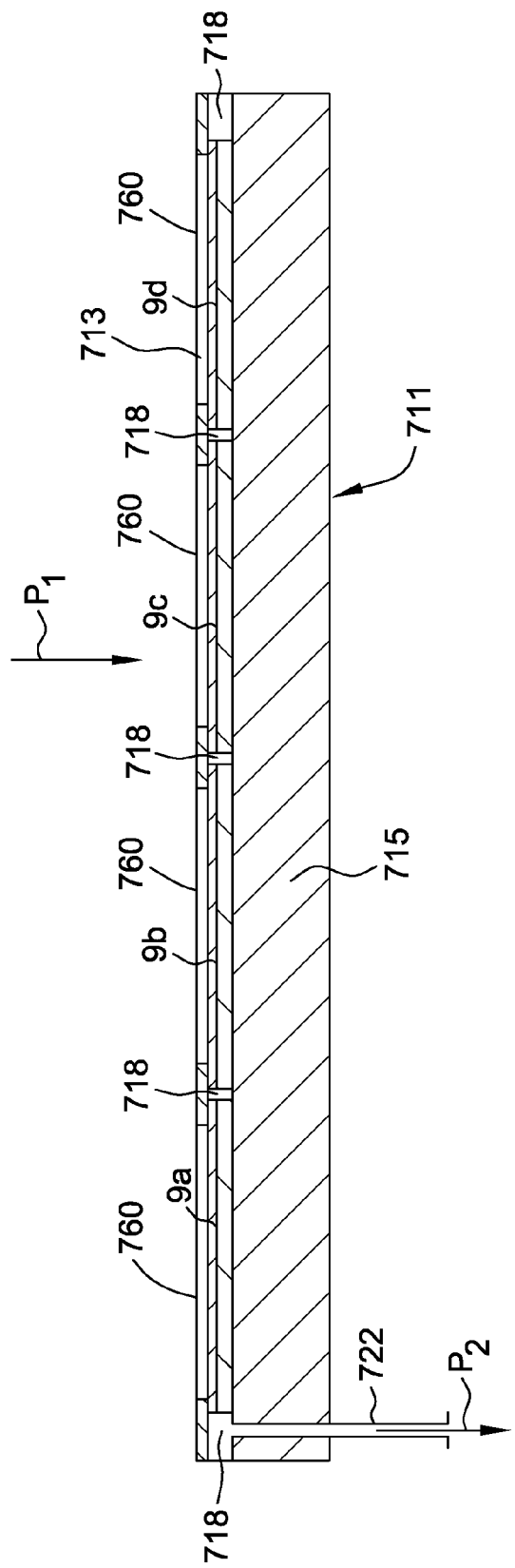
FIG. 14 is a cross-sectional view of a plurality of semiconductor structures and a structure holder for distending the semiconductor structures.

A structure holder for radially distending a structure may be adapted to distend a plurality of structures concurrently as shown in FIG. 14. The holder components shown in FIG. 14 that are analogous to those of FIG. 3 are designated by the corresponding reference number of FIG. 3 plus "700". The holder 711 includes a back plate 715 that is adapted to contact the structures 9a, 9b, 9c, 9d adjacent circumferential edges of the structures. The holder 711 includes a top plate 713 that contacts the structures 9a, 9b, 9c, 9d adjacent circumferential edges of the structures. A peripheral chamber 718 is formed between the back plate 715, top plate 713 and circumferential edges of the structures 9a, 9b, 9c, 9d. The top plate 713 contains chambers 760 that extend to the front surface of the structures 9a, 9b, 9c, 9d to allow the structures to be exposed to the pressure $P_1$ in the main chamber (not shown). The peripheral chamber 718 is maintained at pressure $P_2$.

By maintaining $P_1$ greater than $P_2$, the structures 9a, 9b, 9c, 9d may be radially distended. The difference between $P_1$ and $P_2$ may be at least about 10 MPa and within any of the ranges described above. $P_1$ may be atmospheric pressure and, in such embodiments, the top plate 713 may be a continuous part that does not contain separate chambers 760. While the substrate holder shown in FIG. 14 is described and shown as having only one back plate and one top plate, it should be understood that the holder may have a plurality of separate back or top plates that seal individual structures or groups of structures. Further, while the substrate holder 711 shown in FIG. 14 is capable of radially distending four structures, it should be noted that the holder may be arranged such that more or less structures may be concurrently distended without limitation.

Figure 15:
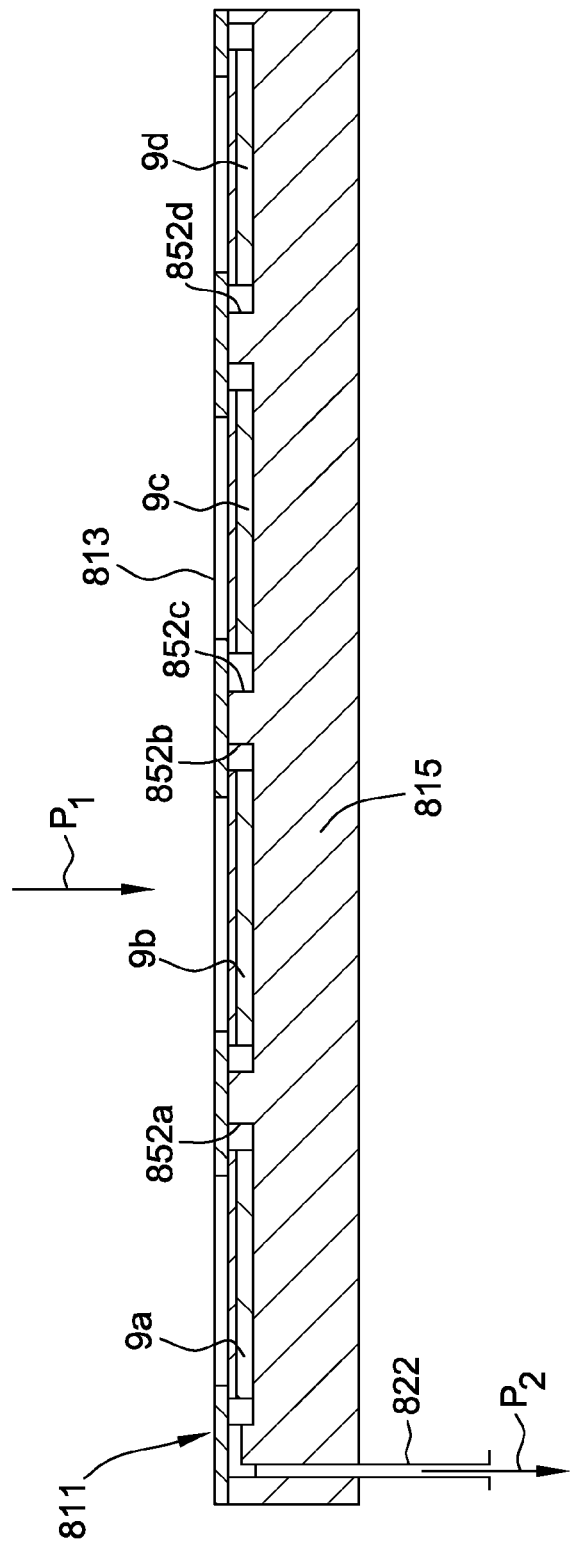
FIG. 15 is a cross-sectional view of a plurality of semiconductor structures and another embodiment of a structure holder for distending the semiconductor structures.

An embodiment of a self-limiting structure holder for processing a plurality of structures is shown in FIG. 15. The holder components shown in FIG. 15 that are analogous to those of FIG. 3 are designated by the corresponding reference number of FIG. 3 plus "800". The back plate 815 includes a number of recesses adapted for receiving the structures 9a, 9b, 9c, 9d. The recesses are defined by annular walls 852a, 852b, 852c, 852d. The annular walls 852a, 852b, 852c, 852d act to limit the radial distension of the structures 9a, 9b, 9c, 9d.

In addition to the apparatus described above, an apparatus that grips the structure (such as at the peripheral edge by use of clamps or other gripping elements) and allows the structure to be distended (stretched) may be used to relax the heterostructure such as in apparatus described below. Referring now to FIGS. 16-21, distension of the structure may be achieved by use of a structure holder that is radially movable relative to the structure. In such embodiments, the structure holder may be part of an apparatus for distending the structure. Such apparatus may be similar to the apparatus 36 shown in FIG. 8 in that the apparatus includes a housing 35 which defines a main chamber 27 in which the holder is mounted. The apparatus may include a heating element 30 to heat the structure 9 during distension by use of any of the structures of FIGS. 16-21 to activate the dislocation source layer.

Figure 16:
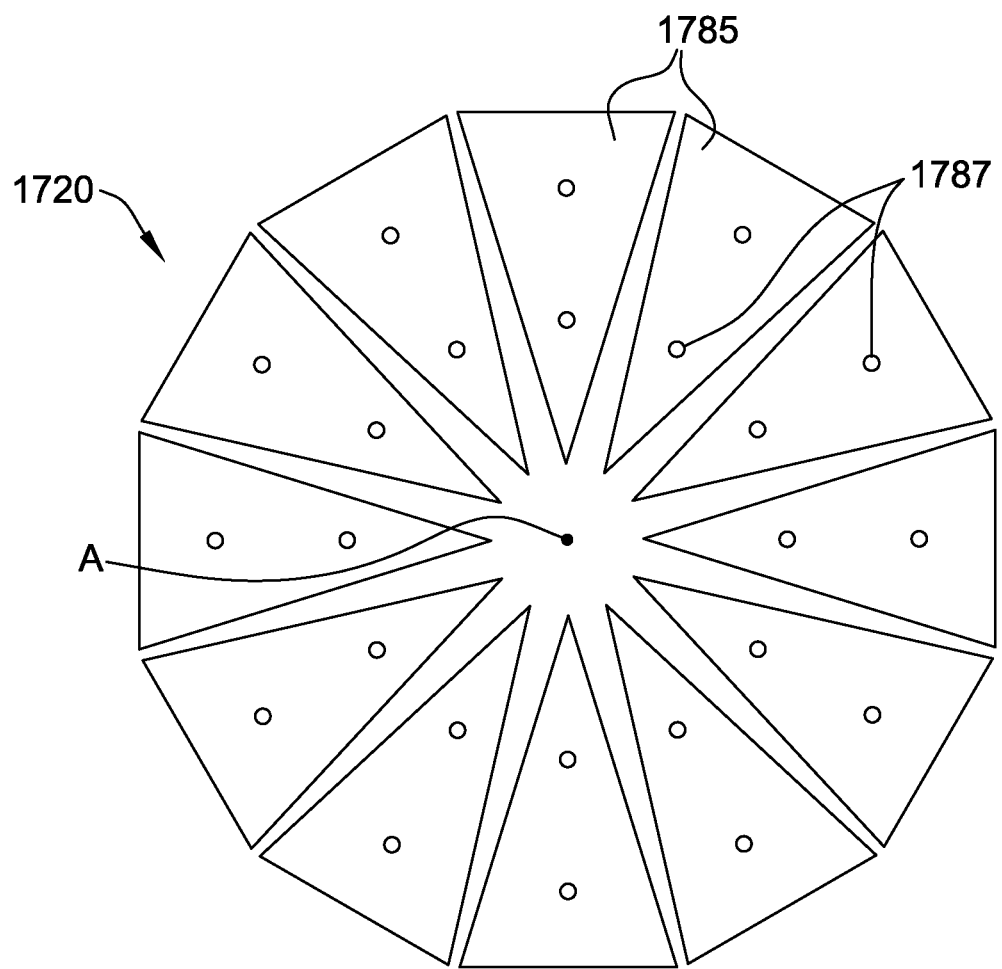
FIG. 16 is a top view of another embodiment of a structure holder for distending a semiconductor structure.

Referring now to FIG. 16, the structure holder 1720 may include a plurality of triangular-shaped segments 1785 that point inward to a central axis A of the holder. Each segment has at least one fluid passageway 1787 formed therein to pull a vacuum on the substrate. The segments 1785 may be mounted for movement outward from the central axis A causing the substrate to distend.

Figure 17:
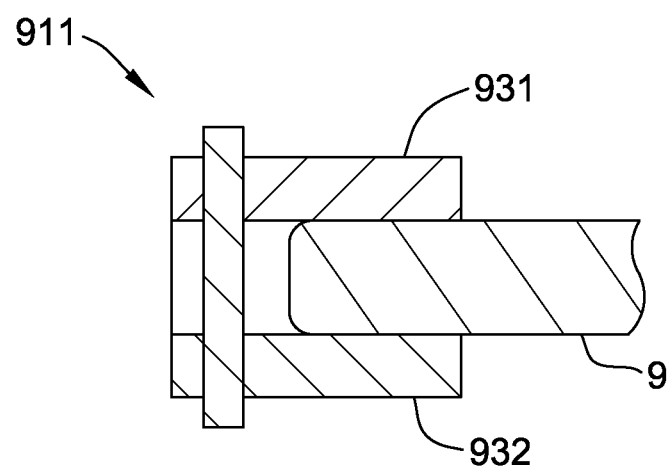
FIG. 17 is a cross-sectional view of a semiconductor structure and another embodiment of a structure holder for distending the semiconductor structure.

Referring now to FIG. 17, the apparatus 911 may be a clamp that includes a front plate 931 and a back plate 932 that exerts a holding force on the substrate 9. As shown in FIG. 17, the top plate 931 and back plate 932 are rings. The top plate 931 may have other shapes and may extend entirely across the substrate 9 without limitation. The front plate 931 and back plate 932 may be movable radially outward from the center of the apparatus by any mechanical methods including use of pneumatics, hydraulics, motors and the like. It should be noted that such mechanical methods may be used to move any of the front plate and/or back plates in the structure holders described below.

Figure 18:
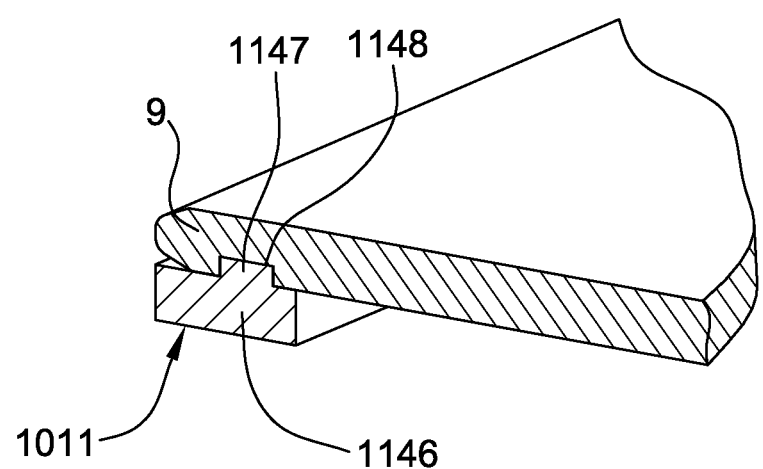
FIG. 18 is a cross-sectional view of a semiconductor structure having a groove and another embodiment of a structure holder for distending the semiconductor structure.

Referring now to FIG. 18, in another embodiment, the structure holder 1011 includes a generally planar back plate 1146 that includes an annular boss 1147 that is sized and shaped to be received in a groove 1148 in the back of the structure 9. The boss 1147 is movable such that it distends the structure 9.

Figure 19:
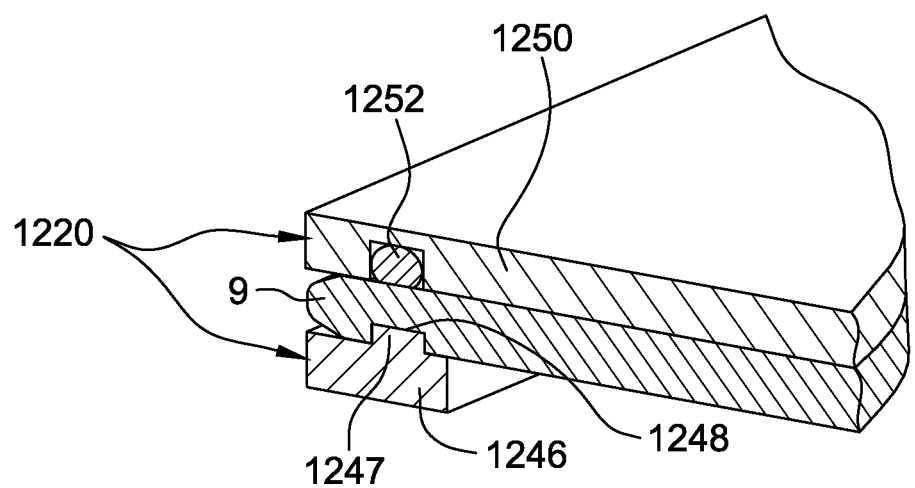
FIG. 19 is a cross-sectional view of a semiconductor structure and the structure holder of FIG. 18 with a top plate.

In some embodiments and as shown in FIG. 19, the structure holder 1220 also includes a front plate 1250 having an annular ring 1252 that extends from the front plate. The ring 1252 exerts a downward force on the structure 9 to prevent the structure from dislodging from the boss 1247 during distension of the structure during heating. Other structures for accomplishing this function are contemplated within the scope of this disclosure.

Figure 20:
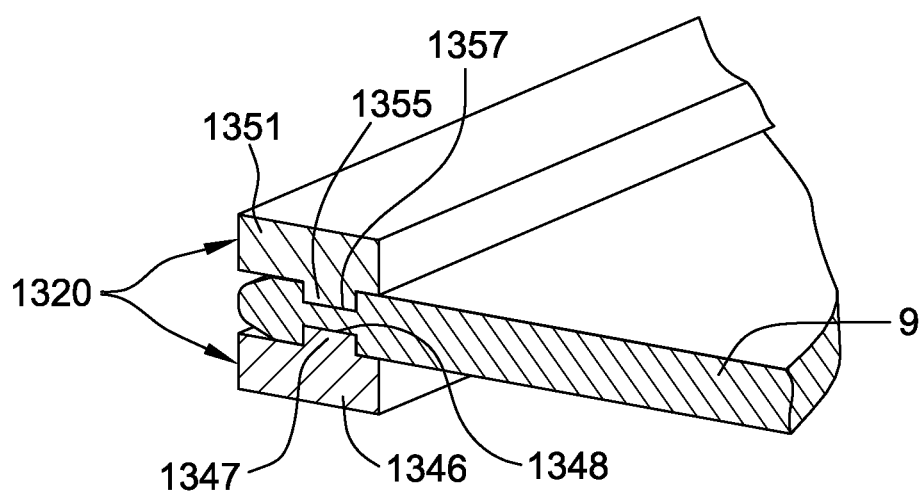
FIG. 20 is a cross-sectional view of a semiconductor structure having two grooves and another embodiment of a structure holder for distending the semiconductor structure.

In other embodiments and as shown in FIG. 20, the structure holder 1320 includes a back plate 1346 and boss 1347 similar or identical to that shown in FIGS. 18 and 19. The substrate holder 1320 also includes a front plate 1351 and a front boss 1355 that is sized and shaped to be received in a groove 1357 in the front surface of the structure 9.

Figure 21:
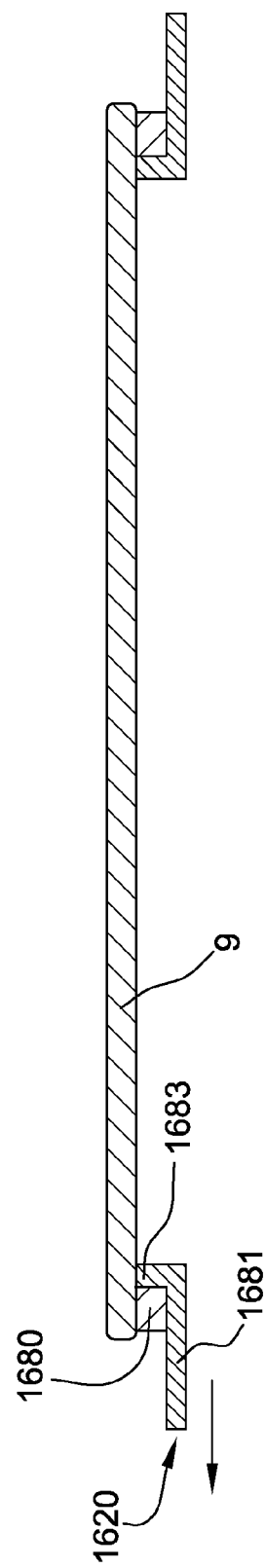
FIG. 21 is a cross-sectional view of a semiconductor structure and another embodiment of a structure holder having a flange.

Referring to FIG. 21, a structure holder 1620 includes a generally planar back plate 1681 and a flange 1683. The structure 9 includes a ring 1680 attached to the back surface of the structure near the peripheral edge of the structure. The flange 1683 is adapted to engage the ring 1680. The support 1681 and flange 1683 are movable relative to the structure to distend the structure.

In some embodiments, the stress applied by the apparatus described above is cycled such as by reducing the differential pressure across the structure (e.g., by decreasing or increasing pressure in the peripheral or main chambers) or by reducing the stress applied in embodiments in which the apparatus grips the substrate. Such cycling may release any elastic stress formed in the structure.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above apparatus and methods without departing from the scope of the disclosure, it is intended that all matter contained in the above description and shown in the accompanying figures shall be interpreted as illustrative and not in a limiting sense.

What is claimed is:

1. A process for relaxing the strain in a heterostructure comprising a substrate, a surface layer disposed on the substrate and an interface between the substrate and the surface layer, the substrate comprising a central axis, a back surface which is generally perpendicular to the central axis, and a diameter extending across the substrate through the central axis, the process comprising:
    forming a dislocation source layer in the substrate; and
    subjecting the dislocation source layer to a stress by radially distending the substrate to generate dislocations and glide the dislocations from the dislocation source layer toward the surface layer.

2. The process as set forth in claim 1 wherein the dislocations are glided to the substrate-surface layer interface and form misfit interfacial dislocations at the interface.

3. The process as set forth in claim 1 wherein the substrate is composed of a material selected from the group consisting of silicon, silicon carbide, sapphire, germanium, silicon germanium, gallium nitride, aluminum nitride, gallium arsenic, indium gallium arsenic or any combination thereof.

4. The process as set forth in claim 1 wherein the surface layer is composed of a material selected from the group consisting of silicon, silicon carbide, sapphire, germanium, silicon germanium, gallium nitride, aluminum nitride, gallium arsenide, indium gallium arsenide or any combination thereof.

5. The process as set forth in claim 1 wherein the surface layer is composed of silicon germanium and the substrate is composed of silicon.

6. The process as set forth in claim 1 wherein the substrate is composed of silicon.

7. The process as set forth in claim 1 wherein the dislocation source layer is formed by any one of:
    slicing the substrate from an ingot comprising semiconductor material;
    lapping the back surface of the substrate;

sand blasting the back surface of the substrate; or implanting ions into the substrate through the back surface of the substrate.

8. The process as set forth in claim 1 wherein the substrate is heated to at least about 550° C. while radially distending the heterostructure.

9. The process as set forth in claim 1 wherein a stress is applied to the heterostructure during the radial distension, the stress being at least about 5 MPa.

10. The process as set forth in claim 1 wherein the substrate is radially distended for a period of at least about 10 seconds.

11. The process as set forth in claim 1 wherein the step of radially distending the substrate comprises radially distending the heterostructure.

12. The process as set forth in claim 1 wherein a stress $S_1$ is applied to the heterostructure during the radial distension, the method further comprising reducing the stress $S_1$ to a stress $S_2$, $S_2$ being less than $S_1$, $S_2$ being a stress less than a threshold value at which dislocations are generated from the dislocation source and above a threshold value which allows the existing dislocations to glide toward the substrate-surface layer interface to produce a substrate substantially free of dislocations.

13. The process as set forth in claim 1 wherein the surface layer is substantially free of threading dislocations.

14. The process as set forth in claim 1 wherein the surface layer continuously extends across the diameter of the substrate.

15. The process as set forth in claim 1 wherein the surface layer comprises discontinuous segments.

16. A process for preparing a relaxed heterostructure, the process comprising:

depositing a surface layer on a front surface of the semiconductor substrate thereby creating a strain between the surface layer and the substrate;

relaxing the strain in the surface layer and the substrate by the process of claim 1.

17. The process as set forth in claim 16 wherein the semiconductor substrate has a lattice constant, $a_S$, and the surface layer has a lattice constant, $a_{SL}$, the ratio $a_{SL}/a_S$ being greater than about 1.

18. The process as set forth in claim 1 wherein the surface layer has a concentration of threading dislocations of less than about $10^4$ threading dislocations/cm$^2$.

19. A method for radially distending a semiconductor structure, the structure having a front surface, a back surface and a circumferential edge, the method comprising:

positioning the substrate into an apparatus, the apparatus including a structure holder comprising a top plate and a back plate, the back plate contacting the structure adjacent a circumferential edge of the structure, the top plate contacting the front surface of the structure and the back plate contacting the back surface of the structure;

forming a peripheral chamber between the top plate, back plate and circumferential edge of the structure; and decreasing the pressure in the peripheral chamber to radially distend the structure.

* * * * *